United States Patent
Yamada

(10) Patent No.: US 9,689,894 B2
(45) Date of Patent: Jun. 27, 2017

(54) WAFER INSPECTION INTERFACE AND WAFER INSPECTION APPARATUS

(71) Applicant: Tokyo Electron Limited, Tokyo (JP)

(72) Inventor: Hiroshi Yamada, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 429 days.

(21) Appl. No.: 14/405,601

(22) PCT Filed: May 31, 2013

(86) PCT No.: PCT/JP2013/065766
§ 371 (c)(1),
(2) Date: Dec. 4, 2014

(87) PCT Pub. No.: WO2013/183740
PCT Pub. Date: Dec. 12, 2013

(65) Prior Publication Data
US 2015/0168449 A1    Jun. 18, 2015

(30) Foreign Application Priority Data
Jun. 6, 2012 (JP) ................................ 2012-128712

(51) Int. Cl.
*G01R 1/073* (2006.01)
*G01R 1/04* (2006.01)
(Continued)

(52) U.S. Cl.
CPC ....... *G01R 1/0408* (2013.01); *G01R 1/07307* (2013.01); *G01R 31/26* (2013.01); *G01R 31/2891* (2013.01)

(58) Field of Classification Search
CPC ........ G01R 1/04; G01R 1/0408; G01R 1/073; G01R 1/07307; G01R 31/26; G01R 31/28;
(Continued)

(56) References Cited

U.S. PATENT DOCUMENTS 6,130,543 A * 10/2000 Iino .................... G01R 31/2891
324/750.2
7,091,733 B2    8/2006 Takekoshi
(Continued)

FOREIGN PATENT DOCUMENTS

CN          1575514 A      2/2005
CN        101609105 A     12/2009
(Continued)

OTHER PUBLICATIONS

International Search Report for PCT/JP2013/065766 dated Sep. 3, 2013.

*Primary Examiner* — Son Le
(74) *Attorney, Agent, or Firm* — Pearne & Gordon LLP

(57) ABSTRACT

A wafer inspection interface 40 includes a probe card 43 including probes 43b provided on a surface facing a wafer W; a pogo frame 42 that supports a surface of the probe card 43 opposite to the surface on which the probes 43b are provided; a table-shaped chuck member 45 facing the probe card 43 with the wafer W therebetween; a cylindrical bellows 46, configured to seal a space between the chuck member 45 and the pogo frame 42, having one end fastened to the pogo frame 42 and a lower flange 46b at the other end to be contacted with the chuck member 45; a length adjusting device that adjusts a length of the bellows 46; a guide member 47 that guides a movement of the bellows 46; and a decompression path 51 that decompresses the space between the chuck member 45 and the pogo frame 42.

9 Claims, 6 Drawing Sheets

(51) Int. Cl.
*G01R 31/28* (2006.01)
*G01R 31/26* (2014.01)
(58) Field of Classification Search
CPC ............... G01R 31/2891; G01R 33/58; G01N
21/9503; G01N 29/2475; G05B
2219/37224; G05B 2219/37191; G05B
2219/35164; F02G 2253/06; F04B 39/047
See application file for complete search history.

(56) References Cited

U.S. PATENT DOCUMENTS

| | | |
|---|---|---|
| 7,855,568 B2 | 12/2010 | Yamada |
| 2011/0095780 A1 | 4/2011 | Nakata |
| 2012/0194213 A1* | 8/2012 | Komatsu ............ G01R 31/2887 324/756.03 |

FOREIGN PATENT DOCUMENTS

| | | |
|---|---|---|
| JP | 2000-164647 A | 6/2000 |
| JP | 2001-203244 A | 7/2001 |
| JP | 2001-338952 A | 12/2001 |
| JP | 2004-140241 A | 5/2004 |
| JP | 2012-063227 A | 3/2012 |
| TW | 201142322 A | 12/2011 |
| WO | 2010/007653 A1 | 1/2010 |

\* cited by examiner

WAFER INSPECTION INTERFACE AND WAFER INSPECTION APPARATUS

CROSS-REFERENCE TO RELATED APPLICATION

This Application is a U.S. national phase application under 35 U.S.C. §371 of PCT Application No. PCT/JP2013/065766 filed on May 31, 2013, which claims the benefit of Japanese Patent Application No. 2012-128712 filed on Jun. 6, 2012, the entire disclosures of which are incorporated herein by reference.

TECHNICAL FIELD

The embodiments described herein pertain generally to a wafer inspection apparatus and a wafer inspection interface including a probe card.

BACKGROUND

As a wafer inspection apparatus, for example, there is known a probe apparatus or a burn-in inspection apparatus that inspects electrical characteristics of multiple semiconductor devices formed on a wafer.

FIG. 7 is a cross sectional view schematically illustrating a configuration of a conventional probe apparatus.

As depicted in FIG. 7, a probe apparatus 100 includes a loader chamber 101 forming a loader region in which a wafer W is transferred; and an inspection chamber 102 in which electrical characteristics of multiple semiconductor devices formed on the wafer W are inspected. Control device controls various devices within the loader chamber 101 and the inspection chamber 102 to inspect the electrical characteristics of the semiconductor devices. The inspection chamber 102 includes a mounting table 106 moved in X, Y, Z and θ directions while mounting thereon the wafer W loaded from the loader chamber 101 by a transfer arm 103; a pogo frame 109 provided above the mounting table 106; a probe card 108 supported by the pogo frame 109; and an alignment device 110 that performs alignment (position alignment) between a multiple number of probes (inspection needles) provided on the probe card 108 and multiple electrodes of semiconductor devices formed on the wafer W with the mounting table 106. As the wafer W and the probe card 108 are aligned by the alignment device 110 and the mounting table 106 in cooperation, the individual probes of the probe card 108 are allowed to come into contact with the corresponding electrodes on the wafer W, and electrical characteristics of the multiple number of semiconductor devices formed on the wafer W are inspected (see, for example, Patent Document 1).

In the above probe apparatus or the conventional wafer inspection apparatus including multiple inspection chambers, a space between a wafer supporting body and a probe card is decompressed in each inspection chamber, so that a wafer is attracted to the probe card, and electrodes of semiconductor devices formed on the wafer are brought into contact with probes provided on the probe card (see, for example, Patent Document 2).

REFERENCES

Patent Document 1: Japanese Patent Laid-open Publication No. 2004-140241

Patent Document 2: Japanese Patent Laid-open Publication No. 2012-063227

DISCLOSURE OF THE INVENTION

Problems to be Solved by the Invention

In the conventional wafer inspection apparatus, however, a lip-shaped O-ring provided on a peripheral portion of a top surface of the wafer supporting body is used as a seal member that seals a space (hereinafter, referred to as "contact space") between the probe card and the wafer supporting body which faces the probe card from the outside. Thus, the wafer inspection apparatus with such an O-ring cannot respond to various probe cards having different probe lengths. For example, when using a probe card having short probes, the contact space needs to be excessively decompressed to achieve secure contact between the probes and the electrodes of the semiconductor devices by strongly compressing the O-ring. At this time, however, the wafer may be deformed or a probe mark (needle mark) on the semiconductor devices on the wafer may be deviated, so that the quality of the semiconductor devices may be degraded.

In view of the foregoing problems, example embodiments provide a wafer inspection interface and a wafer inspection apparatus capable of bringing electrodes of semiconductor devices formed on a wafer into effective contact with probes of a probe card without being affected by the probe length of the probe card.

Means for Solving the Problems

In one example embodiment, a wafer inspection interface includes a probe card including multiple probes, which are provided on a surface of the probe card facing a wafer and correspond to electrodes of multiple semiconductor devices formed on the wafer; a supporting plate configured to support a surface of the probe card opposite to the surface on which the probes are provided; a table-shaped chuck member facing the probe card with the wafer therebetween; a cylindrical bellows member, configured to seal a space between the chuck member and the supporting plate, having one end fastened to the supporting plate and the other end to be brought into contact with the chuck member; a length adjusting device configured to adjust a length of the bellows member; a guide member configured to guide a movement of the bellows member; and a decompression path configured to decompress the space.

The length adjusting device may be configured to adjust the length of the bellows member to have a value calculated by subtracting a preset overdrive amount from a sum of a thickness of the probe card and a thickness of the wafer.

The preset overdrive amount may be in a range from 10 μm to 150 μm.

The bellows member may have a flange at the other end thereof, and may be configured to be brought into contact with the chuck member with the flange therebetween.

The wafer inspection interface may further include a suction path configured to suck a contact surface between the flange and the chuck member and firmly contact the flange with the chuck member.

The bellows member may have a dual structure in which two bellows are concentrically arranged.

The wafer inspection interface may further include a pressure adjusting device configured to adjust a pressure within a space between the two bellows of the bellows member having the dual structure.

The bellows member may include a bellows made of a metal or a synthetic resin.

In another example embodiment, a wafer inspection apparatus includes an inspection chamber in which electrical characteristics of semiconductor devices formed on a wafer; and a transfer device that loads and unloads the wafer into and from the inspection chamber, and the inspection chamber includes a wafer inspection interface. Further, the wafer inspection interface includes a probe card including multiple probes, which are provided on a surface of the probe card facing the wafer and correspond to electrodes of the semiconductor devices formed on the wafer; a supporting plate configured to support a surface of the probe card opposite to the surface on which the probes are provided; a table-shaped chuck member facing the probe card with the wafer therebetween; a cylindrical bellows member, configured to seal a space between the chuck member and the supporting plate, having one end fastened to the supporting plate and the other end to be brought into contact with the chuck member; a length adjusting device configured to adjust a length of the bellows member; a guide member configured to guide a movement of the bellows member; and a decompression path configured to decompress the space.

Effect of the Invention

In accordance with the example embodiments, the cylindrical bellows member, configured to seal the space between the chuck member and the supporting plate, having one end fastened to the supporting plate and the other end to be brought into contact with the chuck member is provided between the chuck member and the supporting plate. By adjusting the length of the bellows member to have a preset value, e.g., a value calculated by subtracting the preset overdrive amount from the sum of the thickness of the probe card and the thickness of the wafer through the length adjusting device, the corresponding electrodes of the semiconductor devices formed on the wafer and the multiple probes of the probe card are allowed to come into contact with each other when the chuck member mounting thereon the wafer is brought into contact with the other end of the bellows member. Accordingly, it is possible to bring the electrodes of the semiconductor devices formed on the wafer into secure contact with the corresponding probes of the probe card without being affected by the length of the probes on the probe card.

MODE FOR CARRYING OUT THE INVENTION

Hereinafter, example embodiments will be elaborated with reference to the accompanying drawings, which form a part hereof.

Figure 1:
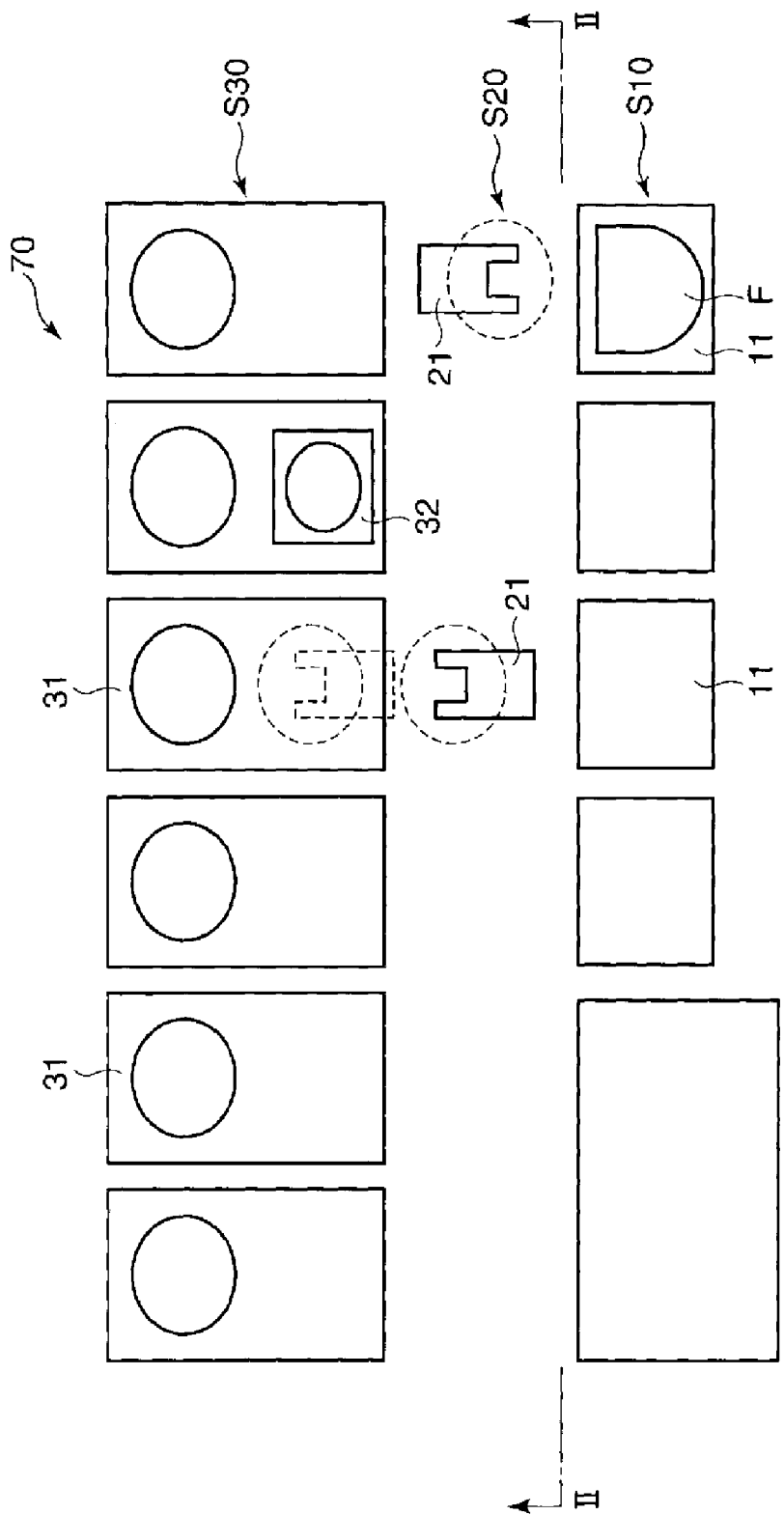
FIG. 1 is a plane view schematically illustrating a configuration of a wafer inspection apparatus in accordance with a first example embodiment.
Figure 2:
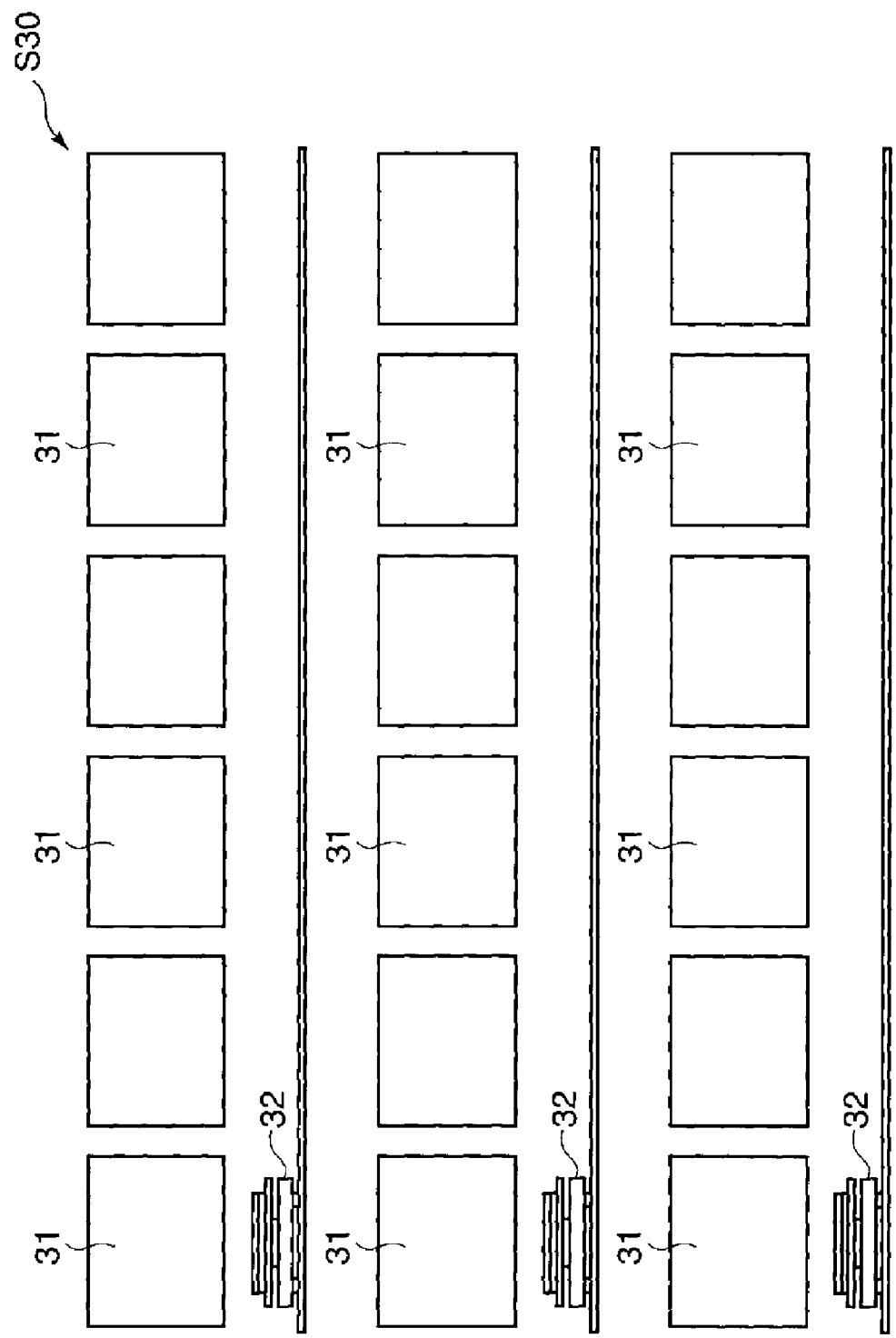
FIG. 2 is a cross sectional view of the wafer inspection apparatus, taken along a line II-II of FIG. 1.

FIG. 1 is a plane view schematically illustrating a configuration of a wafer inspection apparatus including a wafer inspection interface in accordance with a first example embodiment. FIG. 2 is a cross sectional view of the wafer inspection apparatus, taken along a line II-II of FIG. 1. This wafer inspection apparatus serves as a whole-contact type inspection apparatus configured to bring all electrodes of all semiconductor devices formed on a wafer into contact with all corresponding probes of a probe card at one time.

Referring to FIG. 1, a wafer inspection apparatus 70 includes an inspection section S30 in which electrical characteristics of semiconductor devices formed on a wafer are inspected; a loading/unloading section S10 in which a wafer, a wafer tray, a probe card, and so forth are loaded into or unloaded from the wafer inspection apparatus 70; and a transfer section S20 provided between the loading/unloading section S10 and the inspection section S30.

The loading/unloading section S10 is partitioned into a multiple number of unit loading/unloading regions 11. An accommodation member such as, but not limited to, a FOUP is provided in each of the unit loading/unloading regions 11. Further, a preliminary position alignment device (pre-aligner) (not shown) or a needle mark inspection device configured to check a needle mark on an inspected wafer (not shown) may be provided adjacent to a part of the unit loading/unloading regions 11.

A wafer loading/unloading device 21 is provided in the transfer section S20. The wafer loading/unloading device 21 is configured to transfer an uninspected wafer, which is received from the loading/unloading section S10, through the transfer section S20 and deliver the uninspected wafer to a transfer device 32 of the inspection section S30 to be described later, and the wafer loading/unloading device 21 is configured to receive an inspected wafer from the transfer device 32 of the inspection section S30 and transfer the inspected wafer into the loading/unloading section S10.

A multiple number of inspection units 31 (testers) are provided in the inspection section S30. Adjacent inspection units 31 are not particularly separated from each other, and the multiple number of inspection units 31, each of which includes a wafer inspection interface 40, are arranged in one continuous space.

Referring to FIG. 2, the inspection section S30 of the wafer inspection apparatus 70 is divided in multiple levels, e.g., three levels in FIG. 2. For example, the same number of inspection units 31 are arranged on each level, and a position alignment device, a position alignment camera (both of which are not illustrated) and the transfer device 32 configured to be moved between the inspection units 31 are provided on each layer. The transfer device 32 is configured to mount thereon the uninspected wafer received from the loading/unloading device 21 moved in the transfer section 20 and transfer the uninspected wafer into corresponding one of the inspection units 31. Further, the transfer device 32 is configured to transfer an inspected wafer received from the inspection unit 31 into the loading/unloading device 21 moved in the transfer section S20.

Figure 3:
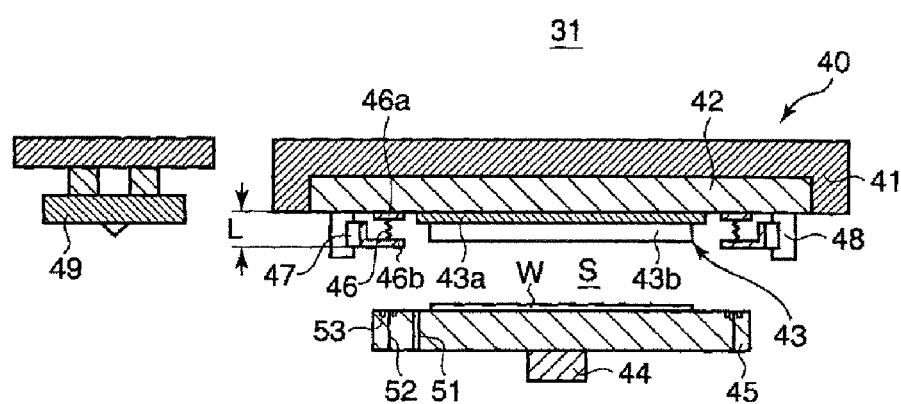
FIG. 3 is a cross sectional view schematically illustrating a wafer inspection interface provided in an inspection unit of FIG. 2.

FIG. 3 is a cross sectional view schematically illustrating a configuration of the wafer inspection interface provided in each inspection unit of FIG. 2.

As depicted in FIG. 3, the wafer inspection interface 40 includes a head plate 41 made of a plate-shaped member provided at a ceiling portion of the inspection unit 31; a supporting plate (hereinafter, referred to as "pogo frame") 42 forming a bottom surface of the head plate 41; a probe card 43 provided on a bottom surface of the pogo frame 42; a rod-shaped elevating device (hereinafter, referred to as "lifter") 44 which stands upright from a bottom of the inspection unit 31 and is configured to be elevated in a vertical direction of FIG. 3; and a table-shaped chuck member 45 provided on a top portion of the lifter 44.

The probe card 43 includes a base plate 43a and a multiple number of probes 43b provided on a surface of the base plate 43a facing a wafer W. The probe card 43 is adsorbed and held by the pogo frame 42. A cylindrical bellows member such as a bellows 46 is provided on the bottom surface of the pogo frame 42 to surround an outer peripheral portion of the probe card 43. An upper end of the bellows 46 is fastened to the pogo frame 42 via a flange 46a therebetween, and a lower end of the bellows 46 is equipped with a lower flange 46b. The bellows 46 is brought into contact with a top surface of the chuck member 45 via the lower flange 46b therebetween.

The bellows 46 is contractible and expandable, and a length L (i.e., a distance L from the pogo frame 42 to a bottom surface of the flange 46b) may be changed by moving the lower flange 46b. A guide member 47 configured to guide a movement of the flange 46b when varying the distance L is provided as one body with the flange 46b. The guide member 47 is configured to guide the movement of the lower flange 46b in a vertical direction in FIG. 3 by being moved up and down along a supporting column 48. Further, the guide member 47 is equipped with a driving device (not shown) as a length adjusting device of the bellows 46. By operating the driving device, the guide member 47 and the lower flange 46b of the bellows 46 are moved, so that the length of the bellows 46 can be adjusted.

For example, the length of the bellows 46 is adjusted to a value calculated by subtracting a preset overdrive amount from a sum of a thickness of the probe card 43 and a thickness of the wafer W, for example. Here, the overdrive amount refers to a movement amount by which the wafer W is further moved toward the probe card 43 (hereinafter, this movement is referred to as "overdrive") after electrodes of semiconductor devices formed on the wafer W are brought into contact with the probes 43b of the probe card 43, so that the multiple electrodes of the semiconductor devices can be brought into secure contact with the multiple probes 43b of the probe card 43. The overdrive amount may be in the range from, e.g., 10 μm to 150 μm and may be determined depending on the kinds of semiconductor devices formed on the wafer as the electrical characteristics inspection target object, inspection conditions, and so forth.

By adjusting the length L of the bellows 46 as stated above, if the chuck member 45 mounting thereon the wafer W is brought into contact with the lower flange 46b of the bellows 46, the multiple electrodes of the semiconductor devices formed on the wafer W and leading ends of the multiple probes 43b of the probe card 43 come into secure contact with each other.

The chuck member 45 is moved by the transfer device 32 (see FIG. 2). The chuck member 45 receives an uninspected wafer W from the loading/unloading device 21 (see FIG. 1) and transfers the uninspected wafer W into a position alignment device 49 moved to a position adjacent to the corresponding inspection unit 31, for example. Then, the position alignment between the chuck member 45 and the wafer W and, besides, the position alignment between the wafer W and the probe card 43 provided at the wafer inspection interface 40 of the inspection unit 31 are performed. Thereafter, the chuck member 45 moves the wafer W aligned with the probe card 43 to a position directly under the wafer inspection interface 40, and the chuck member 45 is then moved upward toward the probe card 43 by the lifter 44. Accordingly, the top surface of the chuck member 45 is brought into contact with the bottom surface of the lower flange 46b. At this time, the multiple electrodes of the semiconductor devices formed on the wafer W are allowed to come into effective and secure contact with the leading ends of the multiple probes 43b of the probe card 43.

With the top surface of the chuck member 45 in contact with the bottom surface of the lower flange 46b of the bellows 46, the lower flange 46b is suctioned through a suction path 52, which is opened to a contact surface of the chuck member 45 in contact with the lower flange 46b and is surrounded by an O-ring 53, so that the chuck member 45 and the flange 46b are firmly contacted to each other. Thereafter, a space S surrounded by the pogo frame 42, the chuck member 45 and the bellows 46 is decompressed by a decompressing device through a decompression path 51 opened to the space S, so that the effective contact state between the electrodes of the semiconductor devices formed on the wafer W and the probes 43b of the probe card 43 is maintained. At this time, a pressure within the space S may be adjusted to, e.g., −3 Pa to −15 Pa.

After the secure contact state between the multiple electrodes of the semiconductor devices on the wafer W and the leading ends of the multiple probes 43b of the probe card 43 is achieved, the inspection unit 31 inspects electrical characteristics of the multiple semiconductor devices formed on the wafer W.

Below, there will be elaborated a process of performing the inspection of electrical characteristics of semiconductor devices formed on a wafer by using the wafer inspection apparatus equipped with the wafer inspection interface having the above-described configuration.

FIG. 4A to FIG. 4D are diagrams illustrating a process of inspecting the electrical characteristics of the semiconductor devices formed on the wafer by using the wafer inspection apparatus having the wafer inspection interface of FIG. 3.

In FIG. 4A to FIG. 4D, the wafer inspection interface 40 is equipped with a probe card having relatively long probes, as compared to those of a wafer inspection interface to be described later with reference to FIG. 5A to FIG. 5D.

When performing the inspection of the electrical characteristics of the semiconductor devices formed on the wafer, the length of the bellows 46 is first adjusted in the wafer inspection interface 40 (FIG. 4A) including the probe card 43 having the multiple probes 43b, which correspond to the electrodes of the semiconductor devices as the electrical characteristic inspection target object and have a preset length.

Figure 4A:
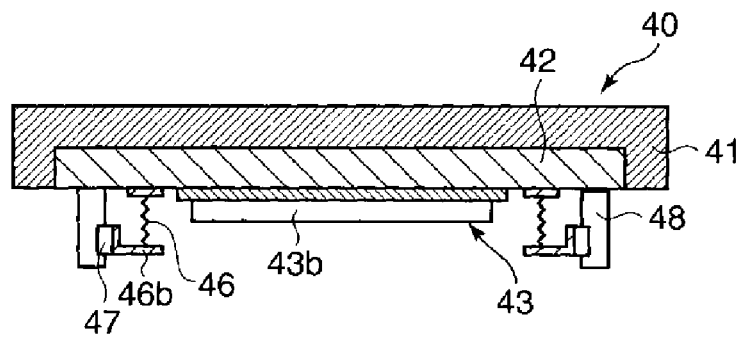
FIG. 4A to FIG. 4D are diagrams illustrating a process of inspecting electrical characteristics of semiconductor devices formed on a wafer by using the wafer inspection apparatus of FIG. 3.
Figure 4B:
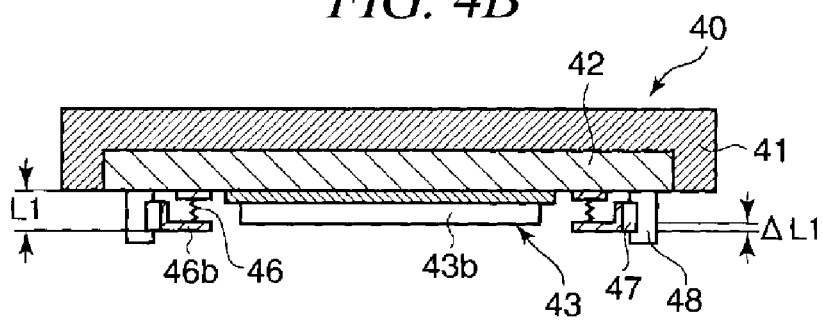

That is, in the wafer inspection interface 40, by moving the guide member 47 along with the lower flange 46b in the vertical direction of FIG. 3 through the non-illustrated driving device (bellows length adjusting device), the length of the bellows 46 is adjusted to a length L1 which corresponds to a value calculated by subtracting an overdrive amount of, e.g., 100 μm from a sum of a thickness of the probe card 43 and a thickness of the wafer W (FIG. 4B).

Figure 4C:
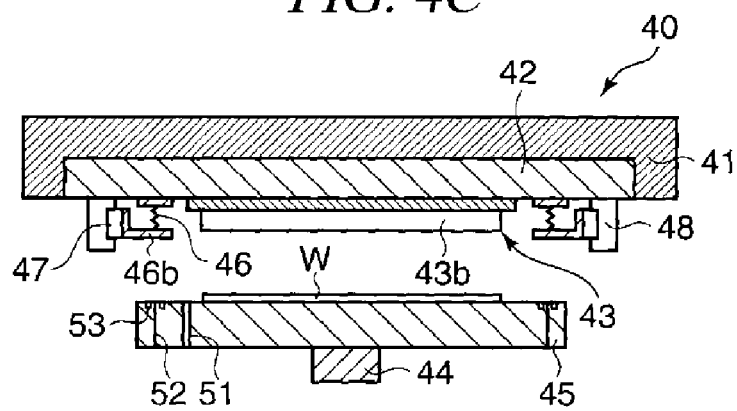

Then, the chuck member 45 moves the transfer device 32 to receive an uninspected wafer W from the loading/unloading device 21 and transfer the wafer W into the position alignment device 49 (FIG. 3) which is moved to a position adjacent to the corresponding inspection unit 31 including the wafer inspection interface 40. Then, the position alignment between the chuck member 45 and the wafer W and, besides, the position alignment between the wafer W and the probe card 43 provided at the wafer inspection interface 40 of the inspection unit 31 are performed. Thereafter, the chuck member 45 is moved to a position under the wafer inspection interface 40 while mounting thereon the wafer W (FIG. 4C).

Figure 4D:
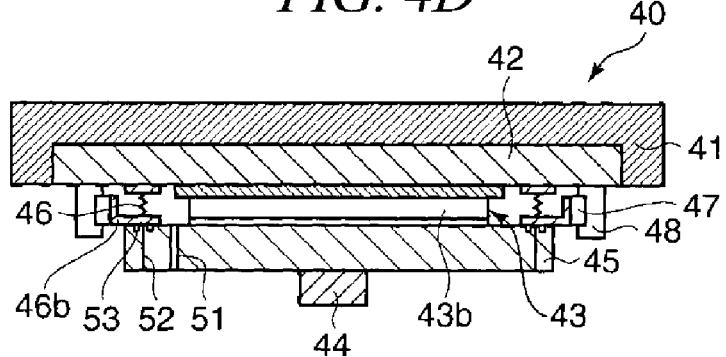
Figure 5A:
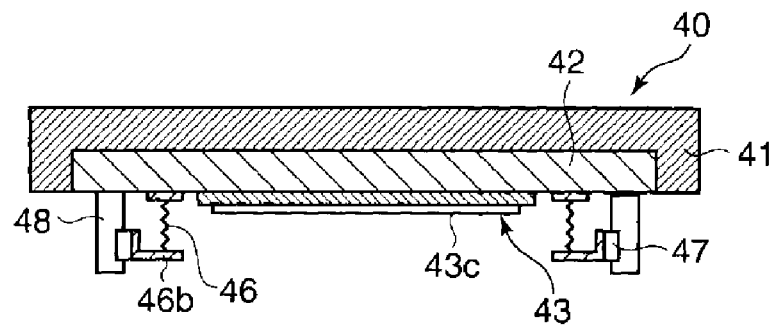
FIG. 5A to FIG. 5D are diagrams illustrating a process of inspecting electrical characteristics of semiconductor devices formed on a wafer by using a wafer inspection apparatus equipped with a probe card having probes shorter than those of the wafer inspection interface of FIG. 4A to FIG. 4D.
Figure 5B:
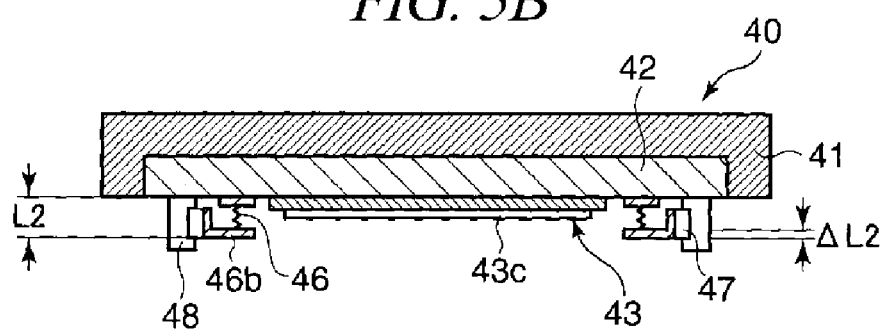
Figure 5C:
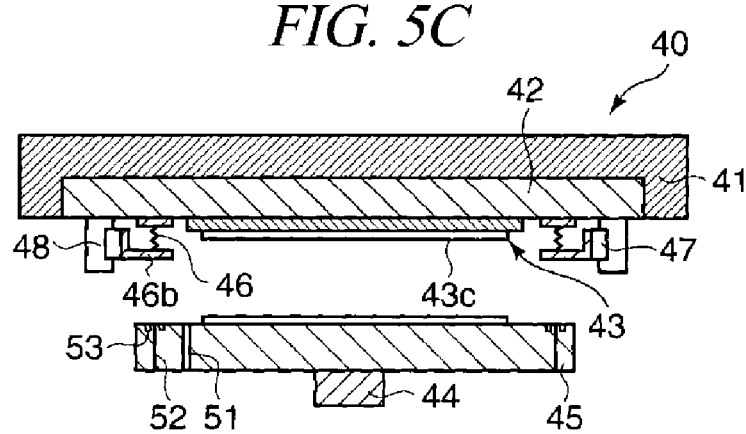
Figure 5D:
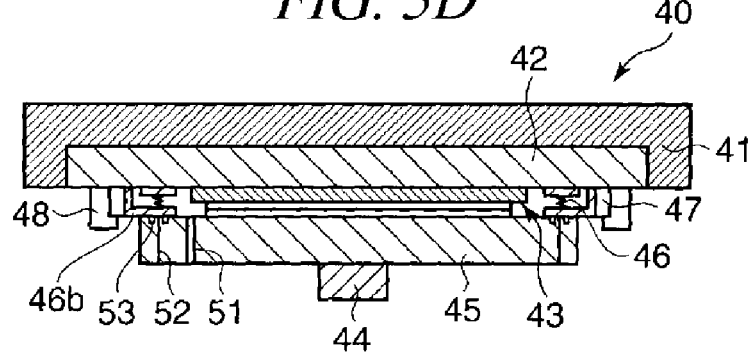

Subsequently, the chuck member 45 mounting thereon the wafer W aligned with the probe card 43 is moved upward by the lifter 44, and the top surface of the chuck member 45 is brought into contact with the lower flange 46b of the bellows 46. At this time, the multiple electrodes of the semiconductor devices formed on the wafer W are respectively brought into contact with the leading ends of the multiple probes 43b of the probe card 43. As the wafer W is overdriven toward the probe card 43 in an amount of, e.g., 100 μm, the multiple electrodes of the semiconductor devices formed on the wafer W are allowed to come into secure contact with the multiple corresponding probes 43b of the probe card 43 (FIG. 4D).

Then, a contact surface between the lower flange 46b of the bellows 46 and the chuck member 45 is suctioned through the suction path 52 by, for example, a non-illustrated vacuum pump, so that the lower flange 46b and the chuck member 45 are firmly contacted to each other. Thereafter, the space S surrounded by the pogo frame 42, the chuck member 45 and the bellows 46 is decompressed through the decompression path 51 opened to the top surface of the chuck member 45 by a non-illustrated decompressing device. As a result, the secure contact state between the multiple electrodes of the semiconductor devices formed on the wafer W and the leading ends of the multiple probes 43b of the probe card 43 can be maintained.

After the wafer W is brought into contact with the probe card 43 provided at the wafer inspection interface 40 as stated above, the inspection unit 31 inspects electrical characteristics of the semiconductor devices formed on the wafer W.

According to the present example embodiment, the space S between the chuck member 45 and the pogo frame 42 is sealed, and the bellows 46 is used as a cylindrical member having one end fastened to the pogo frame 42 and the other end come into contact with the chuck member 45. Further, the bellows length adjusting device configured to adjust the length of the bellows is provided. With this configuration, the length of the bellows 46 can be adjusted to a desired length corresponding to a value calculated by subtracting the preset overdrive amount from the sum of the thicknesses of the probe card 43 and the wafer W. That is, since the length of the bellows 46 is varied depending on the length of the probes 43b of the probe card 43, the electrodes of the semiconductor devices formed on the wafer and the probes of the probe card can be appropriately brought into contact with each other effectively without being affected by the length of the probes 43b of the probe card 43. Thus, it is possible to accurately inspect the electrical characteristics of the semiconductor devices.

Further, since the wafer W is overdriven in the preset overdrive amount after the wafer W is brought into contact with the probe card 43, the electrodes of the semiconductor devices and the probes 43b of the probe card 43 are allowed to come into secure contact with each other, so that electric contact resistance can be reduced.

Further, according to the present example embodiment, since the guide member 47 configured to guide the movement of the bellows and the lower flange of the bellows are provided, the bellows can be suppressed from being wobbled when it is expanded or contracted.

Now, the inspection of electrical characteristics of the semiconductor devices formed on the wafer, which is performed by using a wafer inspection apparatus equipped with a probe card having short probes, will be explained.

FIG. 5A to FIG. 5D are diagrams illustrating a process of inspecting the electrical characteristics of the semiconductor devices formed on the wafer by using a wafer inspection apparatus equipped with a probe card having probes shorter than the probes of the wafer inspection interface in FIG. 4A to FIG. 4D.

Configurations and operations of individual components in FIG. 5A to FIG. 5D are the same as those described in FIG. 4A to FIG. 4D excepting that the length of probes 43c of the probe card 43 in FIG. 5A to FIG. 5D is shorter than the length of the probes 43b of the probe card 43 in FIG. 4A to FIG. 4D. Thus, same parts will be assigned same reference numerals and redundant description will be omitted.

Referring to FIG. 5A to FIG. 5D, a length L2 of the bellows 46 is set to be equivalent to a value calculated by subtracting an overdrive amount (e.g., 100 μm) from a sum of the thickness of the probe card 43 and the thickness of the wafer W. The length L2 of the bellows 46 is smaller than the length L1 of the bellows 46 in FIG. 4A to FIG. 4D. This relationship is established because the length of the probes 43c of the probe card 43 in FIG. 5A to FIG. 5D is shorter than the length of the probes 43b of the probe card 43 in FIG. 4A to FIG. 4D in the wafer inspection apparatus in accordance with the present example embodiment.

In FIG. 5A to FIG. 5D, however, a distance ΔL2 (FIG. 5B) between a leading end of each probe 43c of the probe card 43 and the bottom surface of the lower flange 46b is set to be equal to a distance ΔL1 (FIG. 4B) between a leading end of each probe 43b of the probe card 43 and the bottom surface of the lower flange 46b of the bellows 46 in FIG. 4A to FIG. 4D. The distances ΔL1 and ΔL2 are set to a length obtained by subtracting a preset overdrive amount, e.g., 100 μm from the thickness of the wafer W. Accordingly, when the chuck member 45 is brought into contact with the lower flange 46b of the bellows 46, the electrodes of semiconductor devices formed on the wafer W can be brought into effective and secure contact with the corresponding probes 43c (43b) of the probe card 43, respectively, regardless of the length of the probes. Thus, the subsequent inspection of the electrical characteristics of the semiconductor devices can be performed with high accuracy.

Figure 6:
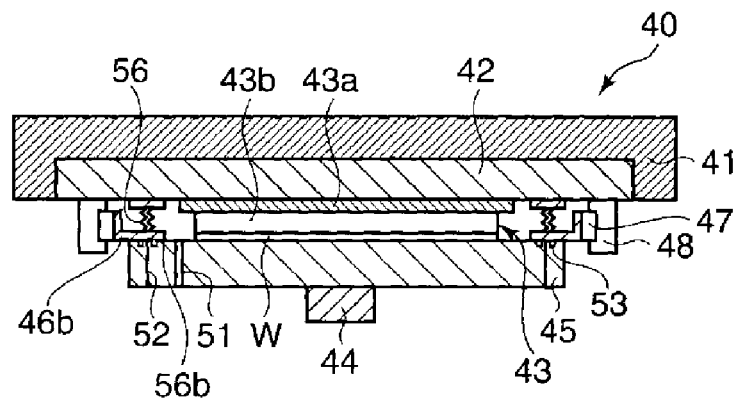
FIG. 6 is a cross sectional view of a wafer inspection interface of a wafer inspection apparatus in accordance with a second example embodiment.
Figure 7:
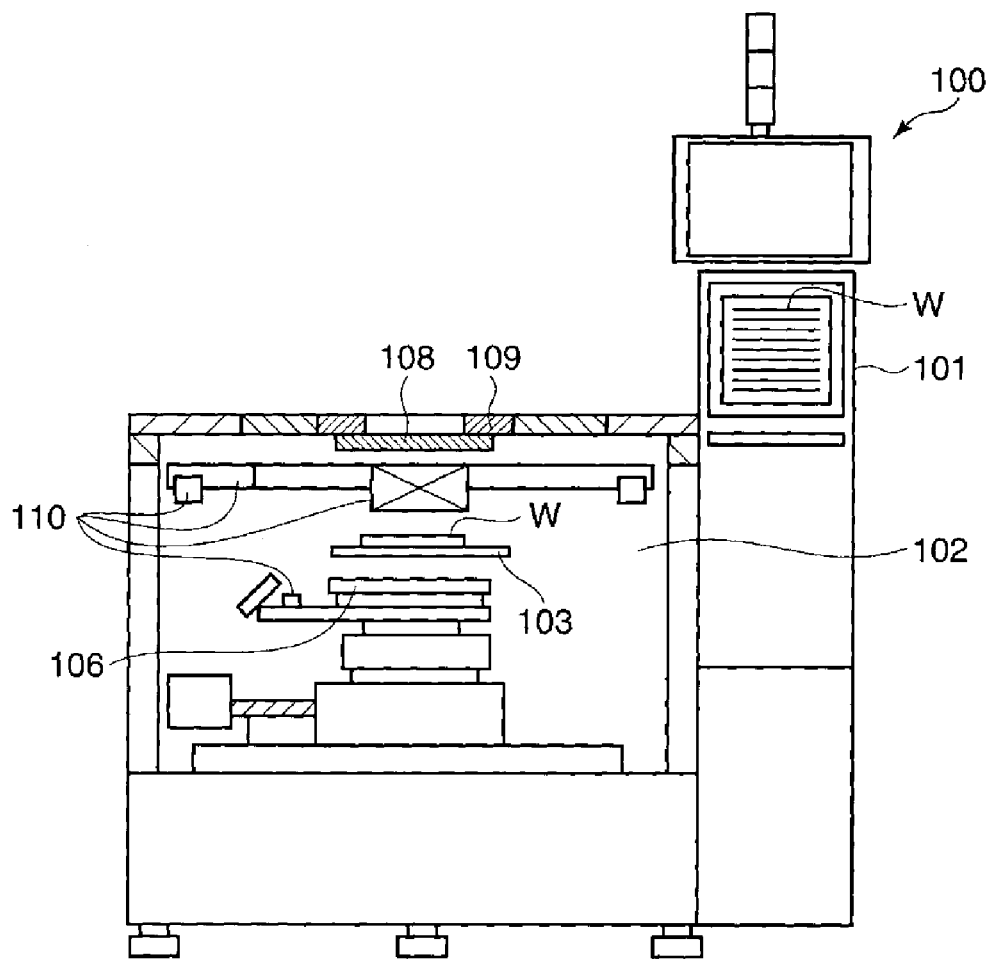
FIG. 7 is a cross sectional view schematically illustrating a conventional probe apparatus.

FIG. 6 is a cross sectional view of a wafer inspection interface of a wafer inspection apparatus in accordance with a second example embodiment. A wafer inspection interface 40 in this wafer inspection apparatus is different from the wafer inspection interface in FIG. 4A to FIG. 4D in that a bellows 56 having a dual structure is used instead of the bellows 46.

The inspection of the semiconductor devices formed on the wafer W using the wafer inspection apparatus in accordance with the second example embodiment is performed in the same manner as described in FIG. 4A to FIG. 4D. By compressing or decompressing a space surrounded by two bellows the dual-structured bellows 56 through using a non-illustrated pressure control device, the lower flange 56b of the bellows 56 can be moved up and down, so that the length of the bellows 56 can be adjusted.

In accordance with the second example embodiment, since the bellows 56 has the dual structure, the length of the bellows 56 can be adjusted to an appropriate length by adjusting the pressure within the space surrounded by the two bellows of the dual-structured bellows. Thus, as in the example embodiment shown in FIG. 4A to FIG. 4D, the electrodes of the semiconductor devices formed on the wafer can be brought into effective contact with the probes of the probe card without being affected by the length of the probes of the probe card. Thus, accuracy of the inspection of the electrical characteristics of the semiconductor device can be improved.

Moreover, since the guide member 47 configured to guide the movement of the bellows is provided in the present example embodiment, an O-ring having a lip-shaped cross section may be used instead of the bellows.

In the above, the example embodiments have been described. However, the example embodiments are not intended to be limiting.

This application claims priority to Japanese Patent Application No. 2012-128712, filed on Jun. 6, 2012, which application is hereby incorporated by reference in its entirety.

EXPLANATION OF REFERENCE NUMERALS

W: Wafer
S: Space
32: Transfer device
40: Wafer inspection interface
42: Pogo frame
43: Probe card
43*b*: probe
44: Elevating device (lifter)
45: Chuck member
46: Bellows
46*b*: Lower flange
47: Guide member

I claim:

1. A wafer inspection interface, comprising:
   a probe card including a plurality of probes, which are provided on a surface of the probe card facing a wafer and correspond to electrodes of a plurality of semiconductor devices formed on the wafer;
   a supporting plate configured to support a surface of the probe card opposite to the surface on which the probes are provided;
   a table-shaped chuck member facing the probe card with the wafer therebetween;
   a cylindrical bellows member, configured to seal a space between the chuck member and the supporting plate, having one end fastened to the supporting plate and the other end to be brought into contact with the chuck member;
   a length adjusting device configured to adjust a length of the bellows member;
   a guide member configured to guide a movement of the bellows member; and
   a decompression path configured to decompress the space.

2. The wafer inspection interface of claim 1,
   wherein the length adjusting device is configured to adjust the length of the bellows member to have a value calculated by subtracting a preset overdrive amount from a sum of a thickness of the probe card and a thickness of the wafer.

3. The wafer inspection interface of claim 2,
   wherein the preset overdrive amount is in a range from 10 μm to 150 μm.

4. The wafer inspection interface of claim 1,
   wherein the bellows member has a flange at the other end thereof, and is configured to be brought into contact with the chuck member with the flange therebetween.

5. The wafer inspection interface claim 4, further comprising:
   a suction path configured to suck a contact surface between the flange and the chuck member and firmly contact the flange with the chuck member.

6. The wafer inspection interface of claim 1,
   wherein the bellows member has a dual structure in which two bellows are concentrically arranged.

7. The wafer inspection interface of claim 6, further comprising:
   a pressure adjusting device configured to adjust a pressure within a space between the two bellows of the bellows member having the dual structure.

8. The wafer inspection interface of claim 1,
   wherein the bellows member includes a bellows made of a metal or a synthetic resin.

9. A wafer inspection apparatus including an inspection chamber in which electrical characteristics of semiconductor devices formed on a wafer; and a transfer device that loads and unloads the wafer into and from the inspection chamber,
   wherein the inspection chamber includes a wafer inspection interface, and
   the wafer inspection interface includes:
   a probe card including a plurality of probes, which are provided on a surface of the probe card facing the wafer and correspond to electrodes of the semiconductor devices formed on the wafer;
   a supporting plate configured to support a surface of the probe card opposite to the surface on which the probes are provided;
   a table-shaped chuck member facing the probe card with the wafer therebetween;
   a cylindrical bellows member, configured to seal a space between the chuck member and the supporting plate, having one end fastened to the supporting plate and the other end to be brought into contact with the chuck member;
   a length adjusting device configured to adjust a length of the bellows member;
   a guide member configured to guide a movement of the bellows member; and
   a decompression path configured to decompress the space.

* * * * *